United States Patent [19]

Kaizer et al.

[11] Patent Number: 4,649,565

[45] Date of Patent: Mar. 10, 1987

[54] ELECTRO-ACOUSTIC CONVERTER WITH COMPENSATED FREQUENCY RESPONSE CHARACTERISTIC

[75] Inventors: Adrianus J. M. Kaizer; Frederik L. J. Sangster; Cornelis A. M. Wesche, all of Eindhoven, Netherlands

[73] Assignee: U.S. Philips Corporation, New York, N.Y.

[21] Appl. No.: 668,533

[22] Filed: Nov. 5, 1984

Related U.S. Application Data

[63] Continuation-in-part of Ser. No. 524,638, Aug. 19, 1983, abandoned.

[30] Foreign Application Priority Data

Sep. 2, 1982 [NL] Netherlands .......................... 8203428

[51] Int. Cl.[4] .......................... H04R 3/04; H04R 1/02; H03F 3/217

[52] U.S. Cl. ...................................... 381/90; 330/127; 330/251; 381/99; 381/111; 381/120; 381/121

[58] Field of Search ................... 381/98, 99, 100, 101, 381/102, 103, 111, 116, 117, 120, 121; 330/251, 132, 127, 135, 136

[56] References Cited

U.S. PATENT DOCUMENTS

| | | | |
|---|---|---|---|
| 3,478,275 | 11/1969 | Walker | 330/127 |
| 3,715,501 | 2/1973 | Russell | 381/98 |
| 3,988,541 | 10/1976 | Boast | 381/98 |
| 4,118,600 | 10/1978 | Ståhl | 381/98 |
| 4,481,662 | 11/1984 | Long et al. | 381/98 |

OTHER PUBLICATIONS

*International Journal of Electronics*, "A Pulse Width Modulated Amplifier", Gok et al., vol. 30, No. 6, 1975 pp. 593–604.

*Primary Examiner*—Gene Z. Rubinson
*Assistant Examiner*—Danita R. Byrd
*Attorney, Agent, or Firm*—Robert T. Mayer; Bernard Franzblau

[57] ABSTRACT

A device for converting an electric signal into an acoustic signal, which comprises an electro-acoustic transducer unit (2) having a quality factor (Q) less than unity. The device further comprises an amplifier circuit (3) for driving the transducer unit. The amplifier circuit has a frequency-dependent gain characteristic (6) which increases towards the lower frequencies, starting from $f_2$, in a frequency range between a first and a second frequency ($f_1$ and $f_2$), $f_1$ being the resonant frequency of the transducer unit (2) and $f_2$ being greater than $f_1$. The efficiency can be increased if amplifier the circuit includes a special amplifier such as a switched amplifier, for example, a class-D amplifier, or an amplifier with a power supply that provides a DC voltage that depends on the drive level of the amplifier.

17 Claims, 10 Drawing Figures

ELECTRO-ACOUSTIC CONVERTER WITH COMPENSATED FREQUENCY RESPONSE CHARACTERISTIC

This is a a continuation-inpart application of U.S. patent application Ser. No. 524,638, 8-19-83, now abandoned.

BACKGROUND OF THE INVENTION

This invention relates to a device for converting an electric signal into an acoustic signal comprising an input terminal for receiving an electric input signal, an electro-acoustic transducer unit, and an amplifier circuit for driving the electro-acoustic transducer unit, which amplifier circuit comprises an input coupled to the input terminal and an output coupled to the electro-acoustic transducer unit. The invention also relates to an amplifier circuit for driving an electro-acoustic transducer unit. Known devices of this type generally comprise a transducer unit whose quality factor is at least substantially equal to 1. The known transducer unit has a frequency-response characteristic which is comparatively flat in a frequency range between the resonant frequency of the transducer unit and the break-up frequency of the transducer unit, for which reference is made to "Theory and numerical calculation of the vibration and sound radiation of cone and dome loudspeakers with non-rigid diaphragms", preprint No. 1437 (D-1) of the 62$^{th}$ Convention of the Audio Engineering Society, held from 13 to 16$^{th}$ of March 1977 in Brussels, in particular FIGS. 5a and 6.

Such transducer units are driven by amplifier circuits (amplifiers) which have a flat frequency-response characteristic. However a drawback of the known device is its relatively low efficiency, which is defined as the ratio of the acoustic output power of the transducer unit to the electric input power applied to the input terminal.

SUMMARY OF THE INVENTION

It is an object of the invention to provide a conversion device having a substantially higher efficiency. According to the invention the device is characterized in that the electro-acoustic transducer unit has a quality factor which is less than unity, and that the amplifier circuit has a frequency-dependent gain factor with a frequency-response characteristic which rolls off in a frequency range between a first frequency, which is substantially equal to the resonant frequency of the transducer unit, and a second frequency which lies above the first frequency. The roll-off is substantially the inverse of the shape of the frequency-response characteristic of the transducer unit in said frequency range. In addition, the amplifier circuit exhibits, in at least a sub-region lying in a region of low drive levels, which sub-region lies at higher drive levels in the said region of low drive levels, an electrical efficiency which is higher than that of a conventional class B amplifier having a fixed supply voltage.

The invention is based on the recognition that the efficiency of the electro-acoustic transducer unit, which is defined as the ratio of the acoustic output power of the transducer unit to the electric input power applied to the transducer unit, depends on the quality factor of the transducer unit. For a formula for the quality factor, reference is made to the following description with reference to FIG. 1. Computations have shown that if the quality factor of the transducer unit (in prior art cases generally equal to approximately 1) is reduced the efficiency of the transducer unit increases over the entire operating-frequency range of the transducer unit. This means that a higher acoustic output power is obtained with the same electric input power.

However, the frequency-response characteristic of the transducer unit changes when the quality factor of the transducer unit is reduced. The low-frequency roll-off, which for transducer units having a quality factor substantially equal to 1 starts at the resonant frequency and falls off towards lower frequencies at a rate of 12 dB/octave, is shifted towards higher frequencies. From a second frequency, which is higher than the resonant frequency of the transducer unit, the frequency-response characteristic for a transducer unit having a Q less than unity falls off towards lower frequencies at a rate of approximately 6 dB/octave, changing into a roll-off at a rate of 12 dB/octave from a third frequency which is lower than the resonant frequency. In fact this results in a reduction of the operating-frequency range of the transducer unit because the lower range limit (for transducer units whose Q=1 approximately equal to the resonant frequency of the transducer unit) has shifted towards a higher frequency, namely the said second frequency.

A further reduction of the quality factor therefore leads to a further increase of the value of the second frequency and thus to a further reduction of the operating-frequency range of the transducer.

This means that, in isolation, a transducer unit is obtained which has a higher efficiency but a smaller operating-frequency range. In order to obtain a device which reproduces frequencies from at least the resonant frequency of the transducer unit, the amplifier circuit for driving the transducer unit must provide compensation for the roll-off between the first and the second frequency in the frequency-response characteristic of the transducer unit. This may be achieved by giving the amplifier circuit a frequency-dependent gain factor to produce a frequency response in the frequency range between the first and the second frequency which is the inverse of the frequency response characteristic of the transducer unit in this range. Therefore, the frequency response of the amplifier circuit in this range increases towards lower frequencies.

If a conventional amplifier circuit is constructed to have the frequency dependent gain factor set forth in the foregoing, it is liable to have a low efficiency, which will in some cases tend to cancel out the increase in efficiency of the transducer unit. If a conventional amplifier, such as a class-A, class-B or a class-AB amplifier having a fixed power supply voltage is used, the power supply voltage of the amplifier should be adapted to the maximum output amplitude that is to be expected in the amplifier. These maximum amplitudes will generally occur in the frequency range around the resonant frequency because the amplifier has a gain factor which is a maximum in this range. This means that the power supply should be chosen to accord with the signal amplitudes in this frequency range. As a result, it is likely that the amplifier will no longer be driven to the full extent in the frequency range above the second frequency in which range the gain factor is substantially lower. This has a negative effect on the amplifier efficiency. This is because class A, B or AB amplifiers have a maximum efficiency at full drive level. In the case of a smaller drive level (as indicated in the foregoing for signals having frequencies higher than $f_2$) the efficiency decreases. For example, for class-A amplifiers the efficiency is substantially proportional to the square of the drive level. For class-B amplifiers the efficiency is proportional to the drive level. According to the invention an amplifier circuit is used which comprises an amplifier having an improved efficiency compared to the conventional amplifiers such as class A, class B or class AB amplifiers.

This can be made clear in the following.

From the foregoing it is clear that, in the frequency region below the first frequency $f_1$, the improvement in efficiency is optimal and corresponds to the improvement realized by using a transducer unit having a quality factor smaller than unity.

It is also clear from the foregoing that, in the frequency region above the second frequency $f_2$, which frequency region corresponds, as far as it concerns the output level of the amplifier circuit, to a region of low drive levels, a large loss in efficiency occurs. This means that the region of low drive levels is the critical region. Especially in this region the amplifier circuit should exhibit an improved efficiency compared to the conventional class A, AB or B amplifiers having a fixed supply voltage. As the class B amplifier of the above-mentioned amplifiers exhibits the highest efficiency, one should keep in mind the fact that the amplifier circuit used will have an efficiency which, in at least a sub-region lying in the said region of low drive levels, which sub-region lies at higher drive levels in the said region of low drive levels, is higher than the efficiency of a conventional class B amplifier having a fixed supply voltage.

As a result of the use of such an amplifier circuit the efficiency can remain high, while maintaining the desired frequency response of the amplifier circuit. This yields a device for converting electric signals into acoustic signals with an increased efficiency in at least the same operating-frequency range, which extends from approximately the resonant frequency into the break-up frequency range. One advantage of this is that one can use amplifiers of a lower power in order to obtain the same acoustic output power.

It should be noted that it is known to drive electro-acoustic transducer units from an amplifier circuit whose frequency-response in a specific frequency range is the inverse of the frequency-response of the transducer unit in this range, so as to provide compensation for a non-flat portion in the frequency-response characteristic of the transducer unit. This is known, for example, from U.S. Pat. No. 4,118,600, see in particular column 1, lines 20 to 23. However, this patent does not mention a transducer unit having a quality factor smaller than unity. Moreover, a boost is applied in the frequency range below the resonant frequency of the transducer unit (the so-called "bass-boost") so that the known amplifier circuit differs completely from the amplifier circuit as proposed in accordance with the invention.

It should be furthermore be noted that U.S. Pat. No. 3,715,501 discloses a device for converting an electrical signal into an acoustic signal, which device comprises an input terminal for receiving an electric input signal, an electro-acoustic transducer unit, and an amplifier circuit for driving the electro-acoustic transducer unit, which amplifier circuit comprises an input coupled to the input terminal and an output coupled to the electro-acoustic transducer unit. The electro-acoustic transducer unit has a quality factor which is less than unity and the amplifier circuit has a frequency-dependent gain factor with a frequency response characteristic which rolls off in a frequency range between the first frequency, which is substantially equal to the resonant frequency of the transducer unit, and a second frequency which lies above the first frequency. This roll-off is substantially the inverse of the shape of the frequency-response characteristic of the transducer unit in said frequency range. However, in this case too, there is no mention of the amplifier circuit having the efficiency as specified in the claim. This means that it is still not possible to obtain a significant improvement in the efficiency of the device.

The electro-acoustic transducer unit is to be selected in such a way that its quality factor is between 0.2 and 0.8, but preferably around 0.4. Furthermore, computations have shown that if the transducer unit comprises an electro-acoustic transducer incorporated in a bass-reflex cabinet the quality factor of the transducer unit should be between 0.1 and 0.6, but suitably around 0.3.

The preference for the value 0.4 (or 0.3) is mainly determined by the factor that the efficiency of the electro-acoustic transducer unit is then substantially constant, i.e. substantially frequency-independent, in the operating-frequency range of the transducer unit. The upper figure of 0.8 (or 0.6) is mainly determined by the fact that the increase in efficiency is not yet particularly high. The lower figure of 0.2 (or 0.1) is determined by the fact that the frequency dependence of the efficiency increases as the quality factor decreases, which is a disadvantage. On the other hand, the difference in the frequency response of the transducer unit for the first and for the second frequency (and thus the degree of compensation in the amplifier circuit) increases as the quality factor decreases. For quality factors smaller than 0.2 (or 0.1) the degree of compensation becomes so high that it cannot readily be achieved by the amplifier circuit without a substantial loss of efficiency in the amplifier circuit. For the last-mentioned reason the frequency response of said amplifier circuit is selected either to be substantially flat in a frequency range below said first frequency or to roll off from said first frequency towards lower frequencies. However, in principle it is also possible to have a rising frequency response of the amplifier circuit at frequencies below the first frequency. This yields a device with an increased efficiency and a wide operating-frequency range, namely an operating-frequency range which extends to below the resonant frequency of the transducer unit.

As already stated with reference to the characteristic feature of the principal claim, the amplifier circuit should be constructed so that the non-flat frequency response causes a minimal loss of efficiency in the amplifier circuit. Tests have shown that this may be achieved by employing an amplifier circuit comprising a switched amplifier, for example a class-D amplifier. The switching is an on/off switching of the output stage of the amplifier and depends on the amplifier's drive level. Another possibility is to employ an amplifier circuit comprising an amplifier whose power supply voltage depends on the drive level of the amplifier. This results in an optimal drive level for all frequencies and for all amplitudes and thus in an optimal efficiency of the amplifier circuit.

BRIEF DESCRIPTION OF THE DRAWING

The invention will now be described in more detail, by way of example, with reference to the drawings. In the drawings.

DESCRIPTION OF THE PREFERRED EMBODIMENTS

Figure 1:
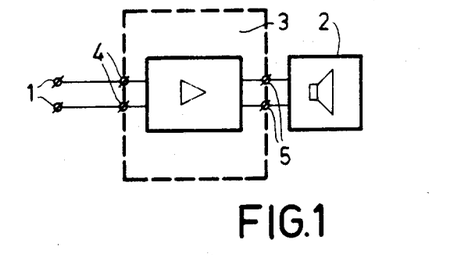
FIG. 1 shows an embodiment of the device in accordance with the invention.

FIG. 1 schematically shows an embodiment of the device in accordance with the invention. The device comprises an input terminal 1 for the application of an electric input signal, an electro-acoustic transducer unit 2, and an amplifier circuit 3 for driving the electro-acoustic transducer unit 2. The amplifier circuit 3 comprises an input 4 coupled to the input terminal 1 and an output 5 coupled to the electro-acoustic transducer unit 2. An electro-acoustic transducer unit is to be understood to mean a separate transducer (loudspeaker) or a transducer accommodated in a known type of enclosure, such as a closed box or a bass-reflex cabinet, or a transducer mounted in a baffle, or a combination of a plurality of transducers accommodated in an enclosure or in a baffle. The transducer unit 2 has a quality factor which is less than 1.

In the case where the transducer unit comprises a number of substantially identical transducers (such as in a loudspeaker column), the quality factor of the transducer unit is meant to be equal to the quality factor of one of the transducers in the transducer unit. However, in the case where the transducer unit comprises a number of (two or three) non identical transducers such as in a two or a three way system (loudspeaker cabinet), the quality factor of the transducer unit is meant to be equal to the quality factor of the low frequency transducer (woofer) in the unit. The same definition applies if one reads "resonant frequency" instead of "quality factor" of the transducer unit.

The quality factor Q of a transducer unit in the form of a moving-coil loudspeaker is defined as $$Q = \frac{1}{R_m + \frac{(Bl)^2}{R_e}} \sqrt{m(k_l + k_b)}$$

in which
- $R_m$ = the mechanical resistance of the mass-spring system comprising the diaphragm (the cone) of the transducer unit and its suspension [$Ns/m$],
- $R_e$ = the electrical resistance of the voice coil [$\Omega$],
- B = the magnetic induction in the air gap [$Wb/m^2$],
- l = the length of the turns of the voice coil located in the air gap [m],
- m = the mass of the diaphragm, the voice coil and the voice-coil former, and the air load [kg],
- $k_l$ = the spring constant of the suspension of the diaphragm [N/m], and
- $k_b$ = spring constant as a result of the air volume behind the diaphragm if the transducer is accommodated in an enclosure. In other cases this term is zero.

One way of reducing the quality factor of the transducer unit is, for example, to increase the magnetic induction in the air gap, for example by using a larger magnet.

Figure 2:
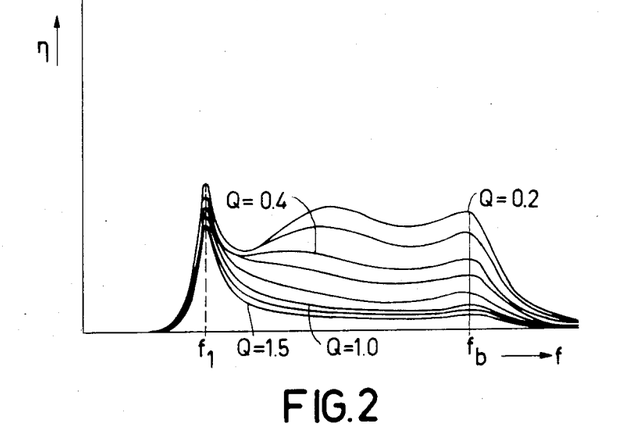
FIG. 2 is a graph showing the efficiency of an electro-acoustic transducer unit as a function of the frequency for a number of transducer units with different quality factors.
Figure 3:
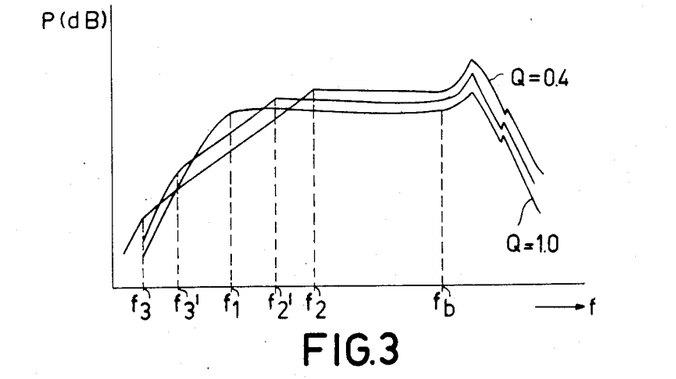
FIG. 3 shows a number of frequency-response curves of transducer units with different quality factors.
Figure 4:
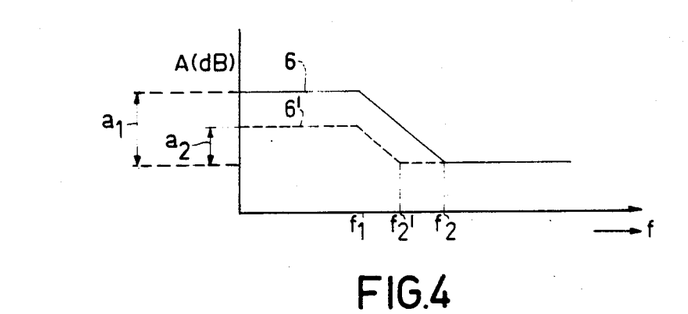
FIG. 4 is a graph showing the gain factor of the amplifier circuit as a function of the frequency for two embodiments of a device in accordance with the invention.

The efficiency of the transducer unit 2 is defined as the ratio of the acoustic output power P of the transducer unit 2 to the electric input power applied to the terminals 5 ($\eta$ P/|U| |I| cos $\phi$, where $\phi$ is the phase angle between the voltage U and the current I applied to the transducer unit). Computations have shown that the transducer unit efficiency depends on the magnitude of the quality factor Q, i.e., the efficiency $\eta$ increases as Q decreases. FIG. 2 shows the results of these computation where the transducer unit does not comprise an electro acoustic transducer in a bass-reflex cabinet. In FIG. 2 the quantity $\eta$ cos $\phi$ is plotted as a function of the frequency f for a plurality of values Q, namely Q=1.5; 1.25; 1.0; 0.8; 0.5; 0.4; 0.3 and 0.2. The quantity $\eta$ cos $\phi$ is plotted linearly along the vertical axis. It can be seen that for a value of Q around 0.4 the efficiency curve (ignoring a small area just above the resonant frequency $f_1$) is substantially frequency-independent. It can also be seen that for values of Q equal to 0.2 or smaller the efficiency becomes highly frequency-dependent. Furthermore, it is apparent that for Q between 1.5 and 0.8 the increase in efficiency for a decreasing Q is not very great. Therefore, the quality factor is generally selected to be between 0.2 and 0.8 but preferably around 0.4. For a device whose transducer unit is an electro-acoustic transducer accommodated in bass-reflex cabinet, the quality factor of the transducer unit is generally between 0.1 and 0.6, but preferably around 0.3. The gain factor A of the amplifier circuit 3 is frequency-dependent. In FIG. 4 this gain factor A as a function of the frequency is indicated by, for example, the (idealized) curve designated 6. The gain factor is plotted on the vertical scale, which is a logarithmic scale. A characteristic feature is that the gain factor increases towards the lower frequencies in a frequency range between a first frequency $f_1$, corresponding to the resonant frequency of the transducer unit 2, and a second frequency $f_2$ above $f_1$. The curve with the reference numeral 6' is a possible alternative characteristic relating to a transducer unit with a higher Q. The explanation is as follows. FIG. 3 shows the acoustic output power P of the transducer unit 2 as a function of the frequency for a constant voltage at the terminals 5 for three transducer units whose respective Q-factors are 1.0; 0.7 and 0.4. The output power P is plotted logarithmatically along the vertical scale. The frequency-response characteristic of the transducer unit whose Q=1 has a compratively flat portion between the resonant frequency $f_1$ and the break-up frequency $f_b$. Below the resonant frequency $f_1$ the frequency response curve falls off towards lower frequencies at a rate of 12 dB/octave. The break-up region is situated above $f_b$. The diaphragm (of a cone loudspeaker) breaks up in this region. The operating-frequency range of a transducer unit having a $Q=1$ is situated substantially between $f_1$ and $f_b$. For a transducer unit having a Q smaller than unity the frequency-response characteristic differs in that the comparatively flat portion, and thus the operating-frequency range of the transducer unit, now extends from a frequency $f_2$, $f_2$ being situated above the resonant frequency $f_1$ and $f_2$ being shifted towards higher frequencies as Q decreases. For the transducers whose $Q=0.4$ and 0.7 this frequency is designated $f_2$ and $f_2'$ respectively. From this frequency the characteristic falls off towards lower frequencies at a rate of approximately 6 dB/oct., changing into a 12 dB/octave roll-off from a third frequency $f_3$ and $f_3'$ respectively, which is lower than the resonant frequency $f_1$.

In order to compensate for the reduction of the operating-frequency range, the gain characteristic of the amplifier circuit 3, at least in the frequency range between $f_1$ and $f_2$ or $f_1$ and $f_2'$, is made to vary in accordance with the inverse of the frequency-response characteristic of the transducer unit 2 in this range. In FIG. 4 this is represented by the curves 6 and 6' respectively. For frequencies higher than $f_2$ (or $f_2'$) the amplifier circuit retains its flat frequency characteristic. In the frequency range between $f_1$ and $f_2$ (or $f_2'$) the gain factor increases towards lower frequencies with a slope of approximately 6 dB/octave. For frequencies lower than $f_1$ the characteristic may rise further, for example up to $f_3$ or $f_3'$, in order to obtain a wider operating frequency range (i.e. having a lower frequency limit than $f_1$) or it may be flat again, or may fall with a certain slope. Suitably, a flat or falling gain characteristic is selected. FIG. 4 shows a flat characteristic for frequencies lower than approximately $f_1$. A reason for not selecting a further rise in the gain characteristic is that the degree of boosting, which is the difference in level $a_1$, and $a_2$ respectively (see FIG. 4), in the gain characteristic for frequencies above $f_2$, and $f_2'$ respectively, and for frequencies lower than $f_1$ should be limited. As this difference in level also depends on the Q-value (a smaller Q means a greater difference in level and consequently a higher degree of boosting), this is a further reason to select the Q-factor so as to be not much smaller than 0.2 (or 0.1 for a transducer in a bass reflex cabinet).

Figure 5:
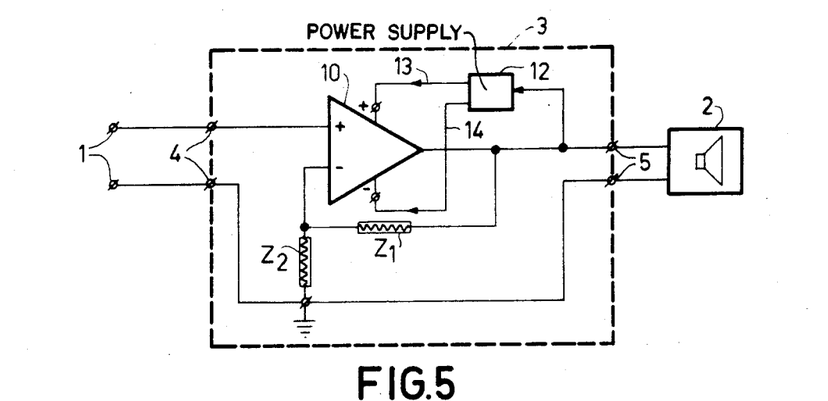
FIG. 5 shows an embodiment comprising an amplifier circuit in the form of an amplifier whose power-supply voltage depends on its output level.
Figure 6:
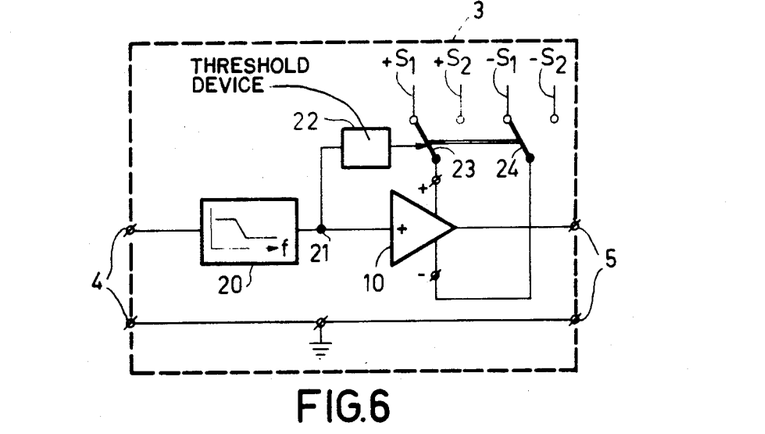
FIG. 6 shows another example of such an amplifier circuit.
Figure 7:
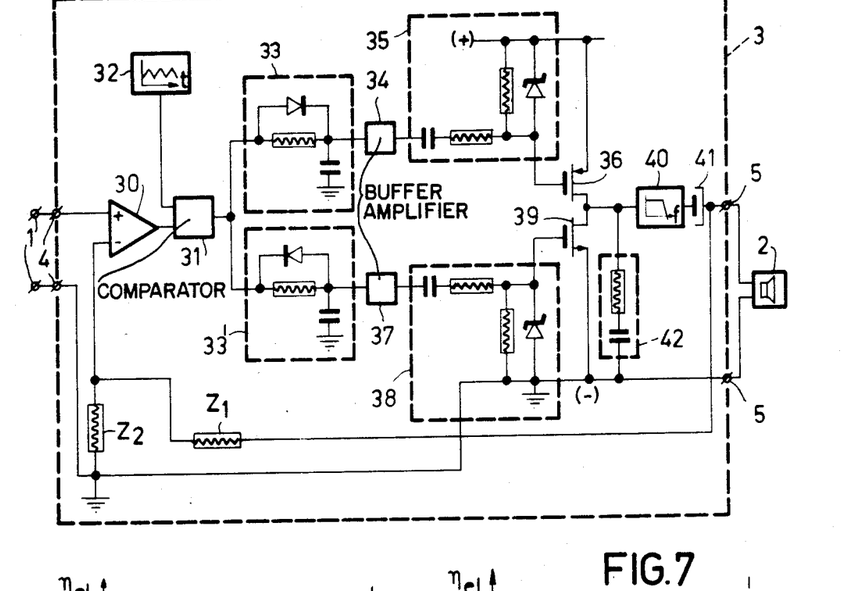
FIG. 7 shows an example of an amplifier circuit in the form of a class-D amplifier.

Suppose that a conventional amplifier (such as a class-A, class-B or class-AB amplifier) having a gain characteristic, such as for example designated by 6 in FIG. 4, is to be used in the amplifier circuit 3 in FIG. 1. Such amplifiers have a fixed power supply over the entire frequency range. The voltage of the power supply is dimensioned so that the maximum output amplitude that is to be expected is reproduced with a minimal distortion. As the amplifier has the maximum gain factor for frequencies below $f_1$, the maximum output amplitude will occur in this frequency range. For signals of frequencies above $f_2$ (or $f_2'$) the amplifier is not driven to the full extent because of its substantially lower gain factor in this frequency range. As the efficiency of a conventional amplifier having a fixed supply voltage is a maximum when the amplifier is driven to the full extent and decreases in the case of a lower output level, the foregoing leads to a reduction of the efficiency of the amplifier, possibly to such an extent that the increase in efficiency obtained by the choice of a transducer unit having a lower Q is in some cases cancelled almost completely. Therefore, the device in accordance with the invention employs a special amplifier whose efficiency is improved compared to the conventional amplifiers (such as class A, class B or class AB amplifiers) that have a fixed supply voltage (see also the discussion concerning FIG. 8b). One possibility is to employ an amplifier having a supply voltage which depends on the drive level of the amplifier. FIGS. 5 and 6 show two examples of such an amplifier. Another possibility is to employ a switched amplifier, for example a class-D amplifier. FIG. 7 shows an example of such an amplifier. FIG. 5 shows an embodiment of the device in accordance with the invention which employs an amplifier whose power supply voltage tracks the output level of the amplifier. The amplifier circuit 3 comprises an operational amplifier 10 having an impedance $Z_1$ and $Z_2$ respectively between its output and its inverting input and between its inverting input and a point of constant potential, in the present case ground. The gain factor from input 4 to output 5 of the amplifier circuit 3 is equal to $(Z_1+Z_2)/Z_2$ assuming that the gain factor of the operational amplifier 10 is very high. The impedances $Z_1$ and $Z_2$ have been selected so that for the gain factor $(Z_1+Z_2)/Z_2$ a frequency response corresponding to curve 6 or 6' in FIG. 4 is obtained. The output of amplifier 10 is coupled to a circuit 12 which, depending on the output level of the amplifier 10, supplies a first and a second power-supply voltage, 13 and 14 respectively, which is fed to the positive and to the negative power-supply terminal respectively of the amplifier 10. The operation of the circuit 12 is such that power-supply voltages 13 and 14 are obtained which track the output level of the amplifier 10.

FIG. 6 shows another example of such an amplifier circuit 3 for driving the transducer unit 2. The amplifier again comprises an operational amplifier 10. In order to obtain the gain characteristic as represented by 6 or 6' in FIG. 4 a filter device 20 is arranged between the input 4 of the amplifier circuit 3 and the input of amplifier 10. The output 21 of the filter device 20 is also connected to the input of a threshold device 22. The output signal of the threshold device 22 controls two interlocked switches 23 and 24. The positive and negative power-supply terminals of the amplifier 10 are connected to a terminal of the switch 23 and a terminal of the switch 24 respectively. In the position of the switches 23 and 24 shown, the amplifier receives fixed power-supply voltages $+S_1$ and $-S_1$, and in the other position of the switches the power supply voltages are $+S_2$ and $-S_2$. The value of the fixed voltage $S_1$ is selected to be sufficient to enable an input signal of a frequency below $f_1$ at input 4 of the amplifier circuit 3 to be amplified without distortion when it has the maximum attainable amplitude. The value of the fixed voltage $S_2$ is selected to be sufficient to enable an input signal of a frequency above $f_2$ at input 4 of the amplifier circuit 3 to be amplified without distortion, even when it has the maximum attainable amplitude. In view of the frequency response of filter 20, this means that, assuming these two maximum attainable amplitudes are the same, $S_1$ is greater than $S_2$, the ratio between them corresponding to the ratio between the levels in the frequency response of the filter 20 below $f_1$ and above $f_2$ respectively, which response corresponds to the frequency-response curve designated 6 in FIG. 4. The threshold value in the threshold device 22 is equal to the maximum attainable level of the output signal at the output 21 of the filter for frequencies above $f_2$. If the actual level at output 21 is higher than said threshold value, the output signal of the threshold device 22 is such that the switches 23 and 24 are in the position shown. The power-supply voltage applied to the amplifier 10 is then high ($S_1$, $-S_1$). This happens only for signals of frequencies below $f_1$ and of an amplitude above the threshold value of the threshold device. If the actual level at output 21 is lower than said threshold value the output signal of the threshold device is such that the switches 23 and 24 are in the opposite position. In the present case, the supply voltage is then low ($S_2$, $-S_2$). This happens for signals having an amplitude below the threshold value of the threshold device, regardless of their frequency. Thus, a varying power supply voltage is obtained. In this case this is a varying power supply voltage with two discrete levels. Obviously, it is possible to construct amplifier circuits whose power supply can vary between three or more discrete levels depending on the level of the signal to be amplified. FIG. 7 shows an embodiment of a device in which the amplifier circit 3 employs a class-D amplifier. Via the input 4 the input signal is supplied to the non-inverting input of a differential amplifier 30. The output of this amplifier is connected to one input of a comparator 31. The other input of the comparator 31 is connected to a ramp generator 32 whose output signal is preferably a triangular signal of a high frequency, for example 40 kHz. This defines the maximum frequency which is reproducible by the amplifier circuit 3, which will be approximately 2 to 5 kHz. This is adequate for an electro-acoustic transducer unit which is intended for the reproduction of bass tones only (a woofer). If high frequencies are to be reproduced by the amplifier circuit the frequency of the ramp generator must be increased correspondingly. The comparator 31 compares the output signal of the differential amplifier 30 with the output signal of the ramp generator 32 and supplies a (binary) output signal which is high (logic "one") if the amplitude of the ramp signal is higher than the output amplitude of the differential amplifier 30 and which is low (logic "zero") if the amplitude of the ramp signal is smaller. The output signal of the comparator 31 is a signal which is pulse-width modulated. The section 33 of the circuit serves to delay the falling edges in the output signal of the comparator 31 by a specific time interval. The section 33' of the circuit serves to delay the rising edges in the output signal of the comparator 31 by a specific time interval. Via a buffer 34 and a circuit section 35 the circuit 33 is coupled to the control electrode (gate) of a P-channel field-effect transistor 36. Further, the circuit 33' is coupled to the control electrode (gate) of an N-channel field-effect transistor 39 via a buffer 37 and a circuit section 38. Via a low-pass filter 40 and a decoupling capacitor 41 the first main electrode (drain) of the two transistors 36 and 39 is connected to the output 5 of the amplifier circuit. The second main electrode (source) of the transistors, 36 and 39 respectively, is coupled to the positive supply voltage terminal (+) and to ground (−) respectively. The output signal of the comparator 31 drives the two transistors 36 and 39 in such a way that transistor 39 is turned off (cut off) and transistor 36 is turned on (becomes conductive) when a falling edge occurs in said output signal, so that a signal current then flows from the positive power supply terminal (+) to the output 5 of the amplifier circuit. When a rising edge occurs in the output signal of the comparator 31 transistor 39 is switched on and transistor 36 is switched off. A signal current then flows from the output 5 via transistor 39 to the negative power-supply terminal (−). As a result of the low-pass characteristic of the filter 40, whose cut-off frequency corresponds to the highest frequency to be reproduced by the amplifier circuit, i.e. to 2 to 4 kHz, a continuously varying signal is produced at the output 5. This signal is an amplified replica of the input signal applied to terminals 4.

Figures 8A, 8B:
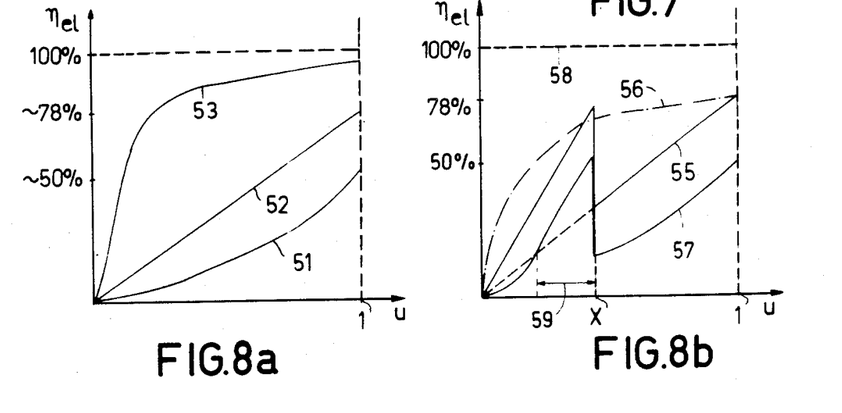
FIGS. 8a and 8b show efficiency curves of various types of amplifiers.

From the foregoing it is evident that the two transistors 36 and 39 conduct alternately. Moreover, care must be taken that they cannot conduct simultaneously because this would result in a large current from the positive power-supply terminal (+) to the negative power-supply terminal (−) via transistors 36 and 39, wherein the current would destroy these transistors. In order to prevent this from happening as a result of the turn-on and turn-off delay of the transistors, the circuits 33 and 33' are provided, which wherein the circuits delay the falling edges and thus the switch-on moment of transistor 36 relative to the switch-off moment of transistor 39, and which delays the rising edges and hence the switch-on moment of transistor 39 relative to the switch-off moment of transistor 36. The circuits 35 and 38 also provide protection against the transistors 36 and 39 breaking down as a result of transients occurring in the amplifier circuit, i.e. when the power-supply voltage is suddenly switched on (or raised), or as a result of over driving. The buffers 34 and 37 serve to amplify the signals in such a way that transistors 36 and 39 are driven with sufficient power. The RC-network 42 serves to compensate for the influence which various stray capacitances in the transistors 36 and 39 stray inductances (for example as a result of the wiring) would otherwise have on the output signal of the amplifier circuit. A series arrangement of two impedances $Z_1$ and $Z_2$ is connected between the output of the amplifier circuit and ground. The junction point between the two impedances is coupled to the inverting input of the differential amplifier 30. The impedances $Z_1$ and $Z_2$ provide negative feedback. Thus, the frequency-dependence of the amplifier circuit, as shown in FIG. 4, is achieved in the same way as in the amplifier circuit shown in FIG. 5. FIG. 8a represents the efficiency of the amplifier circuit of FIG. 7 and the efficiencies of conventional class-A and class-B amplifiers having a fixed supply voltage. FIG. 8a is a graph in which the relative drive level U (meaning the ratio between the real output level and the maximum output level) is plotted along the horizontal axis and electrical efficiency $\eta_{el}$ along the vertical axis. The curves 51 and 52 represent the effieicney of the class-A and the class-B amplifier respectively. It can be seen that the efficiency of a class-A amplifier varies substantially as the square of the drive level. At maximum drive the efficiency is approximately 50%. The efficiency of a class-B amplifier is proportional to the drive level. At maximum drive the efficiency is approximately 78%. Curve 53 indicates the efficiency of the class-D amplifier shown in FIG. 7. The substantial increse in efficiency for all drive levels in comparison with the class-A and B amplifiers is clearly visible. FIG. 8b shows a graph representing the efficiencies of the amplifier circuits as described with reference to FIG. 5 and 6. The solid line 55 represents the efficiency for the amplifier circuit shown in FIG. 6. The value x corresponds to the ratio $S_2/S_1$. It is assumed that amplifier 10 in FIG. 6 is a class-B amplifier. For small drive levels the power supply is switched to the voltage $S_2$, i.e. for relative drive levels between 0 and x the well-known curve for the class-B amplifier is obtained. For larger drive levels the power supply is set to the voltage $S_1$. Relative drive levels between x and 1 again result in the well-known curve for the class-B amplifier. The change from the power-supply voltage $S_2$ to the power-supply voltage $S_1$ in the case of a relative drive level increasing through x results in a drop in the efficiency curve.

It is clear that the amplifier circuit from FIG. 6 exhibits, in a region of low relative drive levels, that is in the region with u<x, an efficiency which is higher than that of the conventional class B amplifier having a fixed supply voltage. If a class A amplifier would have been used for the amplifier 10 in FIG. 6, the curve 57 in FIG. 8b would have been obtained.

It is clear from FIG. 8b that, in a sub-region 59, lying in the said region of low relative drive levels (u<x), wherein the sub-region 59 lies at higher drive levels in the said region of low relative drive levels, the amplifier circuit exhibits an efficiency which is higher than the efficiency of the conventional class B amplifier.

Even an amplifier circuit including a class A amplifier having a supply voltage variable between two discrete values may be preferred over a class B amplifier having a fixed supply voltage. Although the efficiency of the special class A amplifier for large relative output levels (u>x is lower than that of the conventional class B amplifier, there is still an improvement in efficiency compared to an apparatus having a conventional class B amplifier and a transducer unit having a quality factor of unity. Furthermore, an improvement in efficiency has been obtained in the important sub-region 59 compared to the conventional class B amplifier. The total result appears to be better than with the use of a conventional class B amplifier. The result can be improved even more by choosing an amplifier having a supply voltage variable between three or more values.

In the case of an amplifier circuit whose power supply continuously tracks the output level of the amplifier circuit, as described with reference to FIG. 5, an efficiency curve as designated by 56 in FIG. 8b is obtained. Again it is assumed that a class-B amplifier is used for the amplifier 10.

If a momentary tracking of the drive level takes place an efficiency of about 100% is even possible over practically the complete drive level range, independent of the sort of amplifier used, i.e. class A, B or AB.

FIG. 8b clearly shows that in both cases a higher efficiency is obtained over practically the complete drive level range compared with a standard class-B amplifier having a fixed power supply, see the lines indicated by the reference numerals 56 and 58. The description of the class-D amplifier with reference to FIG. 7 states that the maximum frequency reproducible by the amplifier circuit is determined by the frequency of the ramp generator 32 and that if higher frequencies are to be reproduced the frequency of the ramp generator must be increased. However, the ramp-signal frequency may not be increased too far because otherwise the influence of various stray capacitances increases and a higher distortion in the output signal of the amplifier circuit results.

Figure 9:
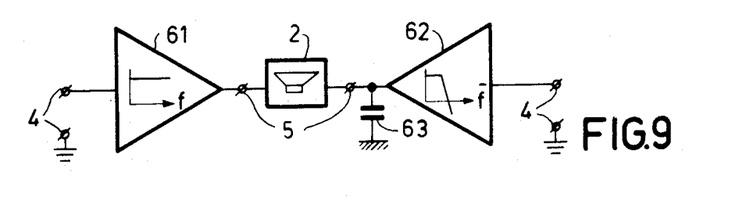
FIG. 9 shows another embodiment of the device in accordance with the invention.

An example of an amplifier circuit which is capable of reproducing a wider frequency range is shown in FIG. 9. The amplifier circuit comprises two amplifier stages 61 and 62 which each receive the input signal. The transducer unit 2 is arranged between the outputs of the two amplifier stages. Amplifier stage 62 inverts the signal applied to its input. Amplifier stage 61 has a frequency response which is flat over the entire frequency range to be reproduced (i.e. from around 20 Hz to approximately $f_b$, see FIGS. 3 and 4). Amplifier stage 62 has a low-pass characteristic which rolls off with approximately 6 dB/octave from the frequency $f_1$. Since the operating range of the amplifier stage 62 is therefore limited to low frequencies, a class-D amplifier as described with reference to FIG. 7 may be used for this stage. The negative-feedback impedances $Z_1$ and $Z_2$ must then be selected to obtain a low-pass characteristic such that only frequencies lower than $f_2$ (or $f_2'$) are reproduced. For the amplifier stage 61 an amplifier whose power supply tracks the output level may then be used. The combination of the two amplifier stages yields precisely the frequency response as shown in FIG. 4. Capacitor 63 is necessary to drain high frequencies above $f_2$ (or $f_2'$) to ground, so as to preclude the draining of these high-frequency signals via amplifier stage 62, which would contribute to a high dissipation in the amplifier stage 62. In some cases the output circuit of the amplifier stage 62 already comprises a capacitor which is connected to ground. Then no additional capacitor 63 is required.

It is to be noted that the invention is not limited to the device and the amplifier circuits as described in the foregoing. The invention may also be applied to devices which differ from the embodiments shown with respect to points which do not relate to the inventive idea. For example, it is alternatively possible to employ other transducer units, for example transducer units with ribbon type transducers or with piezoelectric transducers. In general the quality factor and resonant frequency of transducers will be measured from the frequency characteristic of the diaphragm velocity. This frequency characteristic shows a peak. The frequency at which the peak occurs being the resonant frequency, the width of the peak being a measure of the quality factor.

What is claimed is:

1. A device for converting an electric signal into an acoustic signal comprising, an input terminal for receiving an electric input signal, an electro-acoustic transducer unit, and an amplifier circuit for driving the electro-acoustic transducer unit, said amplifier circuit having an input coupled to the input terminal and an output coupled to the electro-acoustic transducer unit, the electro-acoustic transducer unit having a quality factor less than unity, the amplifier circuit having a frequency dependent gain factor with a frequency response characteristic which rolls off in a frequency range betwen a first frequency, which is substantially equal to the resonant frequency of the transducer unit, and a second frequency which lies above the first frequency, said roll-off being substantially the inverse of the shape of the frequency-response characteristic of the transducer unit in said frequency range, characterized in that the amplifier circuit exhibits, an electrical efficiency which is higher than that of a conventional class B amplifier having a fixed supply voltage in at least a sub-region lying in a region of low drive levels, wherein the subregion lies at higher drive levels in the said region of low drive levels.

2. A device as claimed in claim 1, wherein the quality factor of the electro-acoustic transducer unit is between 0.2 and 0.8.

3. A device as claimed in claim 1, wherein the electro-acoustic transducer unit comprises an electro-acoustic transducer accommodated in a bass-reflex cabinet, characterized in that the quality factor of the electro-acoustic transducer unit is between 0.1 and 0.6.

4. A device as claimed in claim 1 wherein the frequency-response characteristic of said amplifier circuit in a frequency range below said first frequency is at least substantially flat or rolls-off towards lower frequencies from approximately said first frequency.

5. A device as claimed in claim 1 wherein the amplifier circuit comprises a switched amplifier.

6. A device as claimed in claim 5 wherein the amplifier is a class-D amplifier.

7. A device as claimed in claim 1 wherein said amplifier circuit comprises an amplifier having a power-supply voltage that depends on the drive level of the amplifier.

8. A device as claimed in claim 1 wherein the amplifier circuit gain factor varies inversely with frequency in the frequency range between said first and second frequencies.

9. A device as claimed in claim 1 wherein the quality factor of the electro-acoustic transducer unit is 0.4.

10. A device as claimed in claim 1 wherein the amplifier circuit comprises a switched amplifier, and the quality factor of the electro-acoustic transducer unit is between 0.2 and 0.8.

11. An electro-acoustic converter system comprising: an input terminal for receiving an electric input signal, an electro-acoustic transducer unit, and an amplifier circuit for driving the electro-acoustic transducer unit, said amplifier circuit having an input coupled to the input terminal and an output coupled to the electro-acoustic transducer unit, the electro-acoustic transducer unit having a quality factor less than unity, the amplifier circuit having a frequency-dependent gain factor with a frequency-response characteristic which rolls-off in a frequency range between a first frequency, which is substantially equal to the resonant frequency of the transducer unit, and a second frequency which lies above the first frequency, wherein the roll-off is substantially the inverse of the shape of the frequency-response characteristic of the transducer unit in said frequency range, characterized in that the amplifier comprises a class D amplifier circuit.

12. An electro-acoustic converter system as claimed in claim 11 wherein said class D amplifier comprises: a differential amplifier having a first input coupled to said input terminal, a high-frequency ramp generator, a comparator having first and second inputs coupled to outputs of the differential amplifier and the ramp generator, respectively, said comparator having an output which supplies a pulse-width modulated binary-type signal, first and second field-effect transistors having a common output terminal coupled to the electro-acoustic transducer unit, means coupling control electrodes of said field-effect transistors to the output of the comparator so that said first and second field-effect transistors are alternately driven into conduction, and a negative feedback circuit coupling an output of the amplifier circuit to a second input of the differential amplifier.

13. An electro-acoustic converter system as claimed in claim 12 wherein said coupling means comprises, first and second networks connected between the output of the comparator and the control electrodes of the first and second field-effect transistors, respectively, each network comprising, in cascade, a delay circuit and a series-connected RC network coupled to a source of supply voltage via a zener diode, and wherein the common output terminal of the field-effect transistors is coupled to the electro-acoustic transducer unit via a low-pass filter.

14. An electro-acoustic converter system as claimed in claim 11 wherein said class D amplifier comprises a switched amplifier that is switched dependent on the amplifier drive level.

15. An electro-acoustic converter system comprising, an input terminal for receiving an electric input signal, an electro-acoustic transducer unit, and an amplifier circuit for driving the electro-acoustic transducer unit, said amplifier circuit having an input coupled to the input terminal and an output coupled to the electro-acoustic transducer unit, the electro-acoustic transducer unit having a quality factor less than unity, the amplifier circuit having a frequency-dependent gain factor with a frequency-response characteristic which exhibits a roll-off in a frequency range between a first frequency, which is substantially equal to the resonant frequency of the transducer unit, and a second frequency which lies above the first frequency, wherein the roll-off is substantially the inverse of the shape of the frequency-response characteristic of the transducer unit in said frequency range, and wherein said amplifier circuit comprises an amplifier having a power-supply voltage that depends on the drive level of the amplifier.

16. An electro-acoustic converter system as claimed in claim 15 wherein the amplifier comprises an operational amplifier having a first input coupled to said input terminal and an output coupled to said electro-acoustic transducer unit, said amplifier circuit further comprising, a DC voltage supply circuit responsive to an output signal at the output of said operational amplifier to supply DC operating voltages to said operational amplifier that change in accordance with the level of said operational amplifier output signal thereby to provide the amplifier with said frequency-dependent gain factor to produce said roll-off in the frequency-response characteristic that varies inversely with the frequency-response characteristic of the transducer unit in said frequency range.

17. An electro-acoustic converter system as claimed in claim 15 wherein said amplifier comprises an operational amplifier and the amplifier circuit comprises, in cascade, a filter circuit and said operational amplifier coupled between the input terminal and the electro-acoustic transducer unit, and a threshold device coupled to an output of the filter circuit for selectively controlling the DC power supply voltage to the operational amplifier as a function of an output signal of the filter circuit.

* * * * *